United States Patent
Shigaki et al.

(10) Patent No.: US 11,008,420 B2
(45) Date of Patent: May 18, 2021

(54) RESIN COMPOSITION, PREPREG, METAL FOIL-CLAD LAMINATE, RESIN COMPOSITE SHEET, AND PRINTED WIRING BOARD

(71) Applicant: MITSUBISHI GAS CHEMICAL COMPANY, INC., Tokyo (JP)

(72) Inventors: Masahiko Shigaki, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/960,181

(22) PCT Filed: Jan. 8, 2019

(86) PCT No.: PCT/JP2019/000176
§ 371 (c)(1),
(2) Date: Jul. 6, 2020

(87) PCT Pub. No.: WO2019/138992
PCT Pub. Date: Jul. 18, 2019

(65) Prior Publication Data
US 2021/0032404 A1 Feb. 4, 2021

(30) Foreign Application Priority Data

Jan. 9, 2018 (JP) .............................. JP2018-001490

(51) Int. Cl.
| C08G 65/48 | (2006.01) |
| B32B 15/08 | (2006.01) |
| C08J 5/24 | (2006.01) |
| C08L 35/08 | (2006.01) |
| H05K 1/03 | (2006.01) |

(52) U.S. Cl.
CPC ............ *C08G 65/485* (2013.01); *B32B 15/08* (2013.01); *C08J 5/24* (2013.01); *C08L 35/08* (2013.01); *H05K 1/0373* (2013.01)

(58) Field of Classification Search
CPC ........ C08G 65/485; C08K 3/013; C08K 3/36; B32B 15/08; C08J 5/24; C08L 35/08; H05K 1/0373
USPC ....................................................... 526/262
See application file for complete search history.

(56) References Cited

U.S. PATENT DOCUMENTS

| 2008/0300350 A1 | 12/2008 | Ohno et al. |
| 2009/0203279 A1 | 8/2009 | Mori et al. |
| 2017/0051109 A1 | 2/2017 | Mizuno et al. |
| 2017/0166729 A1* | 6/2017 | Hu ............................. C09D 5/18 |
| 2017/0313854 A1 | 11/2017 | Kobayashi et al. |
| 2018/0002485 A1 | 1/2018 | Tanigawa et al. |
| 2020/0001573 A1 | 1/2020 | Saito et al. |
| 2021/0002480 A1 | 1/2021 | Toshimitsu et al. |

FOREIGN PATENT DOCUMENTS

| JP | 2008-218496 | 9/2008 |
| JP | 2009-40934 | 2/2009 |
| JP | 2009-161725 | 7/2009 |
| JP | 2010-138364 | 6/2010 |
| JP | 2010-212291 | 9/2010 |
| TW | 201720861 | 6/2017 |
| TW | 201840709 | 11/2018 |
| WO | 2015/152427 | 10/2015 |
| WO | 2016/072404 | 5/2016 |
| WO | 2016/114286 | 7/2016 |
| WO | 2017/122460 | 7/2017 |
| WO | 2019/131306 | 1/2021 |

OTHER PUBLICATIONS

International Search Report issued in International Patent Application No. PCT/JP2019/000176, dated Mar. 5, 2019.

* cited by examiner

*Primary Examiner* — Hui H Chin
(74) *Attorney, Agent, or Firm* — Renner, Kenner, Arthur M. Reginelli

(57) ABSTRACT

Provided is a resin composition comprising a polymaleimide compound (A) represented by the following general formula (1), a modified polyphenylene ether (B) having a terminal modified with a substituent containing a carbon-carbon unsaturated double bond, and a filler (C):

[Formula 1]

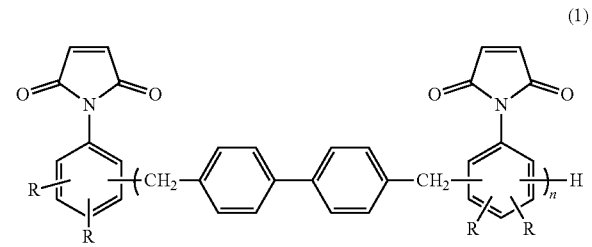

(1)

wherein a plurality of R each independently represent a hydrogen atom, an alkyl group having 1 to 5 carbon atoms, or a phenyl group; and n is an average value and represents $1 < n \leq 5$.

12 Claims, No Drawings

RESIN COMPOSITION, PREPREG, METAL FOIL-CLAD LAMINATE, RESIN COMPOSITE SHEET, AND PRINTED WIRING BOARD

TECHNICAL FIELD

The present invention relates to a resin composition, a prepreg, a metal foil-clad laminate, a resin composite sheet, and a printed wiring board.

BACKGROUND ART

In recent years, high integration and miniaturization of semiconductors used for communication devices, communication instruments, personal computers, and the like have progressed. Along with this progress, various characteristics required for laminates (e.g., metal foil-clad laminates) for semiconductor packages used in printed wiring boards for use in them have become increasingly severe. Examples of the main characteristics required include peel strength, low water absorption properties, desmear resistance, flame resistance, low dielectric constant, low dielectric loss tangent, low thermal expansion rate, and heat resistance.

In order to obtain printed wiring boards for which these characteristics are improved, studies have been performed on resin compositions used as materials of printed wiring boards. For example, Patent Literature 1 discloses a resin composition for printed wiring boards, comprising a combination of a specific bifunctional vinyl benzyl compound containing a polyphenylene ether skeleton (a), a specific maleimide compound (b), a specific cyanate resin (c), and a specific epoxy resin (d) as constituents at a predetermined ratio, for the purpose of achieving excellent varnish storage stability at low temperatures, and preventing reduction in characteristics, such as multilayer moldability, heat resistance after moisture absorption, electrical characteristics, and peel strength, even in a winter period and for a long period of time.

Patent Literature 2 discloses a resin composition comprising a combination of a specific cyanate compound (A), a specific polymaleimide compound (B), and a filler (C) as constituents, for the purpose of improving plating peel strength and low water absorption properties.

CITATION LIST

Patent Literature

Patent Literature 1: Japanese Patent Laid-Open No. 2010-138364 (Japanese Patent No. 5233710)
Patent Literature 2: WO 2016/072404

SUMMARY OF INVENTION

Technical Problem

The Examples of PATENT LITERATURE 1 disclose that when the resin composition comprising the constituents (a) to (d) is used for a copper-clad laminate, low dielectric loss tangent and peel strength are improved. However, PATENT LITERATURE 1 does not aim to improve low water absorption properties, desmear resistance, and flame resistance, and these characteristics are not evaluated in the Examples.

In contrast, the Examples of PATENT LITERATURE 2 disclose that when the resin composition comprising the constituents (A) to (C) is used for a metal foil-clad laminate, low water absorption properties and plating peel strength are improved. However, PATENT LITERATURE 2 does not aim to improve low dielectric loss tangent, desmear resistance, and flame resistance, and these characteristics are not evaluated in the Examples.

Accordingly, an object of the present invention is to provide a resin composition that can simultaneously satisfy excellent peel strength, low water absorption properties, desmear resistance, and flame resistance when used for printed wiring board materials (e.g., laminates and metal foil-clad laminates) etc., and to also provide a prepreg, a metal foil-clad laminate, a resin composite sheet, and a printed wiring board.

Solution to Problem

As a result of intensive studies to achieve the above object, the present inventors found that when a specific polymaleimide compound (A), a specific modified polyphenylene ether (B), and a filler (C) are combined, the resulting resin composition can simultaneously satisfy excellent peel strength, low water absorption properties, desmear resistance, and flame resistance when used for printed wiring board materials (e.g., laminates and metal foil-clad laminates) etc. Thus, the present invention has been completed.

That is, the present invention is as follows.

[1] A resin composition comprising a polymaleimide compound (A) represented by the following general formula (1), a modified polyphenylene ether (B) having a terminal modified with a substituent containing a carbon-carbon unsaturated double bond, and a filler (C),

[Formula 1]

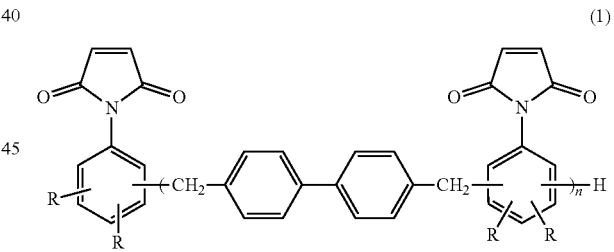

(1)

wherein a plurality of R each independently represent a hydrogen atom, an alkyl group having 1 to 5 carbon atoms, or a phenyl group; and n is an average value and represents $1 < n \leq 5$.

[2] The resin composition according to [1], wherein the modified polyphenylene ether (B) is represented by the following general formula (2):

[Formula 2]

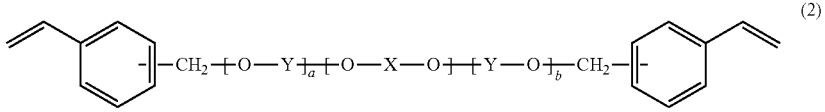

(2)

wherein —(O—X—O)— is a structure represented by the following general formula (3) or the following general formula (4); —(Y—O)— is a structure represented by the following general formula (5); when a plurality of —(Y—O)— are continuously arranged, a single type of structure may be arranged, or two or more types of structures may be arranged regularly or irregularly; a and b each independently represent an integer of 0 to 100, and at least one of a and b is not 0,

[Formula 3]

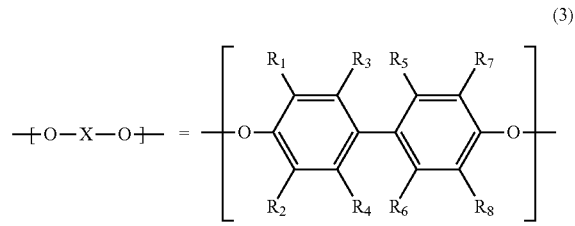

(3)

wherein $R_1$, $R_2$, $R_3$, $R_7$, and $R_8$ each independently represent a halogen atom, an alkyl group having 6 or less carbon atoms, or a phenyl group; and $R_4$, $R_5$, and $R_6$ each independently represent a hydrogen atom, a halogen atom, an alkyl group having 6 or less carbon atoms, or a phenyl group,

[Formula 4]

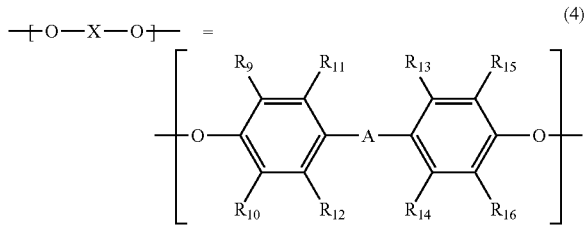

(4)

wherein $R_9$, $R_{10}$, $R_{11}$, $R_{12}$, $R_{13}$, $R_{14}$, $R_{15}$, and $R_{16}$ each independently represent a hydrogen atom, a halogen atom, an alkyl group having 6 or less carbon atoms, or a phenyl group; and -A- represents a linear, branched, or cyclic divalent hydrocarbon group having 20 or less carbon atoms,

[Formula 5]

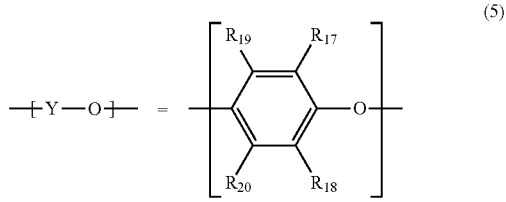

(5)

wherein $R_{17}$ and $R_{18}$ each independently represent a halogen atom, an alkyl group having 6 or less carbon atoms, or a phenyl group; and $R_{19}$ and $R_{20}$ each independently represent a hydrogen atom, a halogen atom, an alkyl group having 6 or less carbon atoms, or a phenyl group.

[3] The resin composition according to [2], wherein in the general formula (2), —(O—X—O)— is a structure represented by the following general formula (6), the following general formula (7), or the general formula (8); —(Y—O)— is a structure represented by the following general formula (9) or the following general formula (10); and when a plurality of —(Y—O)— are continuously arranged, a single type of structure is arranged, or the structures represented by the following general formula (9) and the following general formula (10) are arranged regularly or irregularly:

[Formula 6]

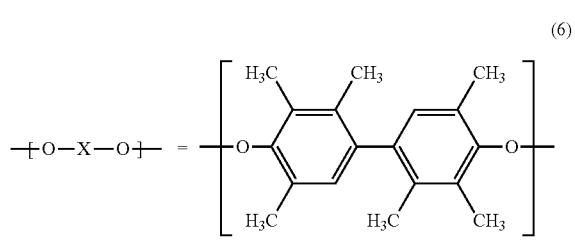

(6)

[Formula 7]

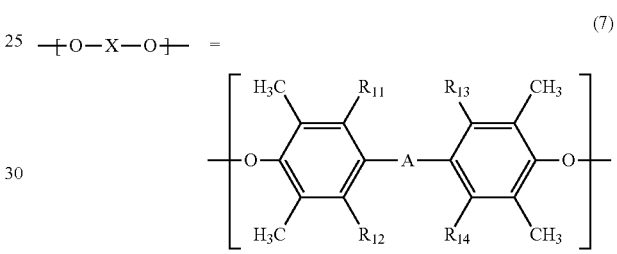

(7)

wherein $R_{11}$, $R_{12}$, $R_{13}$, and $R_{14}$ each independently represent a hydrogen atom or a methyl group; and -A- represents a linear, branched, or cyclic divalent hydrocarbon group having 20 or less carbon atoms,

[Formula 8]

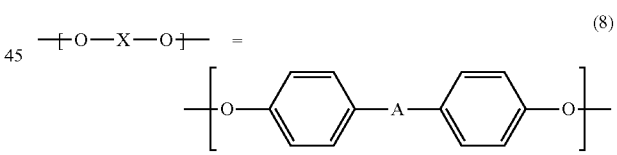

(8)

wherein -A- represents a linear, branched, or cyclic divalent hydrocarbon group having 20 or less carbon atoms,

[Formula 9]

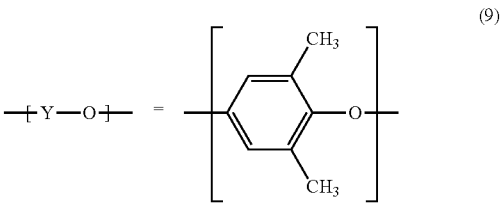

(9)

[Formula 10]

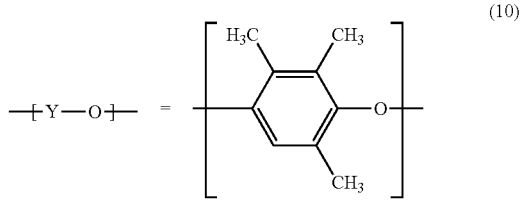

[4] The resin composition according to any one of [1] to [3], wherein the content of the polymaleimide compound (A) represented by the general formula (1) is 1 to 90 parts by mass based on 100 parts by mass of resin solid content in the resin composition.

[5] The resin composition according to any one of [1] to [4], wherein the content of the modified polyphenylene ether (B) is 1 to 90 parts by mass based on 100 parts by mass of resin solid content in the resin composition.

[6] The resin composition according to any one of [1] to [5], further comprising at least one or more other components (D) selected from the group consisting of maleimide compounds other than the polymaleimide compound (A) represented by the general formula (1), epoxy resins, phenol resins, oxetane resins, benzoxazine compounds, compounds having a polymerizable unsaturated group other than the modified polyphenylene ether (B), elastomers, active ester compounds, and cyanate compounds.

[7] The resin composition according to any one of [1] to [6], wherein the content of the filler (C) in the resin composition is 50 to 1600 parts by mass based on 100 parts by mass of the resin solid content.

[8] A prepreg comprising a base material and the resin composition according to any one of [1] to [7] impregnated or applied to the base material.

[9] A metal foil-clad laminate comprising at least one or more stacked prepregs according to [8], and a metal foil disposed on one side or both sides of the prepregs.

[10] A resin composite sheet comprising a support and the resin composition according to any one of [1] to [7] disposed on a surface of the support.

[11] A printed wiring board comprising an insulating layer and a conductor layer disposed on a surface of the insulating layer, wherein the insulating layer comprises the resin composition according to any one of [1] to [7].

Advantageous Effect of Invention

The present invention can provide a resin composition that can simultaneously satisfy excellent peel strength, low water absorption properties, desmear resistance, and flame resistance when used for printed wiring board materials (e.g., laminates and metal foil-clad laminates) etc., and also provide a prepreg, a metal foil-clad laminate, a resin composite sheet, and a printed wiring board.

DESCRIPTION OF EMBODIMENTS

An embodiment for carrying out the present invention (hereinafter referred to as "the present embodiment") is described in detail below. The following embodiment is only an example for describing the present invention, and the present invention is not limited only to the embodiment.

[Resin Composition]

The resin composition of the present embodiment comprises a polymaleimide compound (A) represented by the following general formula (1), a modified polyphenylene ether (B) having a terminal modified with a substituent containing a carbon-carbon unsaturated double bond, and a filler (C). Due to the above structure, the resin composition of the present embodiment can simultaneously satisfy excellent peel strength, low water absorption properties, desmear resistance, and flame resistance, and can, for example, simultaneously improve the above characteristics, when used for printed wiring board materials (e.g., laminates and metal foil-clad laminates) etc. Moreover, due to the above structure, the resin composition of the present embodiment can satisfy, for example, excellent low dielectric loss tangent when used for printed wiring board materials (e.g., laminates and metal foil-clad laminates) etc.

[Formula 11]

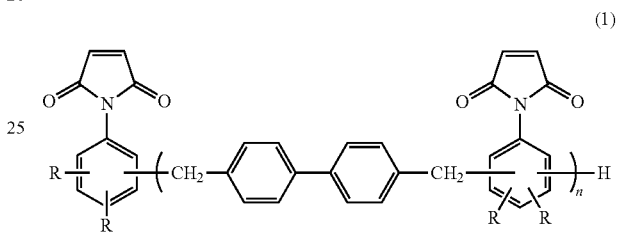

In the general formula (1), a plurality of R each independently represent a hydrogen atom, an alkyl group having 1 to 5 carbon atoms, or a phenyl group; and n is an average value and represents $1<n\leq5$.

[1. Polymaleimide Compound (A)]

The polymaleimide compound (A) of the present embodiment is a compound represented by the general formula (1). Since the resin composition of the present embodiment comprises a polymaleimide compound having such a structure, it can impart excellent heat resistance, and can improve peel strength, low water absorption properties, desmear resistance, and flame resistance, when used for printed wiring board materials (e.g., laminates and metal foil-clad laminates) etc.

In the general formula (1), a plurality of R each independently represent a hydrogen atom, an alkyl group having 1 to 5 carbon atoms (e.g., a methyl group, an ethyl group, an n-propyl group, an isopropyl group, an n-butyl group, an isobutyl group, a t-butyl group, or an n-pentyl group), or a phenyl group. Among these, in terms of further improving flame resistance and peel strength, a group selected from the group consisting of a hydrogen atom, a methyl group, and a phenyl group is preferable, a hydrogen atom or a methyl group is more preferable, and a hydrogen atom is even more preferable.

In the general formula (1), n is an average value and represents $1<n\leq5$. n is preferably 4 or less, more preferably 3 or less, and even more preferably 2 or less, in terms of further excellent solvent solubility.

The polymaleimide compound represented by the general formula (1) may be prepared by a known method or may be a commercial product. The commercial product is, for example, "MIR-3000," a product of Nippon Kayaku Co., Ltd.

The content of the polymaleimide compound (A) is preferably 1 to 90 parts by mass, more preferably 10 to 85 parts by mass, and even more preferably 10 to 75 parts by mass (preferably 10 to 70 parts by mass, more preferably 10 to 60 parts by mass, and even more preferably 10 to 55 parts by mass), based on 100 parts by mass of resin solid content in the resin composition. Because the content of the polymaleimide compound (A) is 1 part by mass or more, flame resistance tends to be further improved. Because the content of the polymaleimide compound (A) is 90 parts by mass or less, peel strength and low water absorption properties tend to be further improved.

The ratio of the modified polyphenylene ether (B) to 100 parts by mass of the polymaleimide compound (A) is not particularly limited. In terms of heat resistance and peel strength, the ratio of the modified polyphenylene ether to 100 parts by mass of the polymaleimide compound (A) may be 1 to 150 parts by mass, and in terms of peel strength, the ratio is preferably 10 to 100 parts by mass, more preferably 10 to 60 parts by mass, even more preferably 10 to 50 parts by mass, and particularly preferably 10 to 30 parts by mass.

The "resin solid content in the resin composition" refer to components other than the solvent and the filler (C) in the resin composition, unless otherwise specified. When the resin composition further contains a dispersant, a silane coupling agent, a curing accelerator, and various additives, which are described later, these components are also excluded. The phrase "100 parts by mass of the resin solid content" means that the total of components other than the above in the resin composition is 100 parts by mass.

[2. Modified Polyphenylene Ether (B)]

The modified polyphenylene ether (B) is a modified product in which the terminal of polyphenylene ether is modified with a substituent containing a carbon-carbon unsaturated double bond. The "polyphenylene ether" mentioned in the present specification refers to a compound having a polyphenylene ether skeleton represented by the following general formula (X1).

[Formula 12]

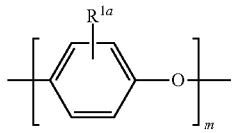

(X1)

In the general formula (X1), $R^{1a}$ represents a hydrogen atom, an alkyl group, an aryl group, an alkenyl group, an alkynyl group, a formyl group, an alkylcarbonyl group, an alkenylcarbonyl group, or an alkynylcarbonyl group; and m is the number of repeating units and represents an integer of 1 or more.

Examples of the substituent containing a carbon-carbon unsaturated double bond include (i) a substituent represented by the following general formula (X2), (ii) a substituent represented by the following general formula (X3), and (iii) a substituent represented by the following general formula (X4).

[Formula 13]

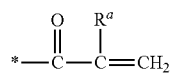

(X2)

In the general formula (X2), $R^a$ represents a hydrogen atom or an alkyl group, and * represents a bond.

[Formula 14]

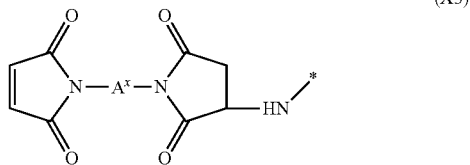

(X3)

In the general formula (X3), $A^x$ represents a group represented by the following general formula (X3a), (X3b), (X3c), or (X3d).

[Formula 15]

(X3a)

In the general formula (X3a), $R^{x1}$ each independently represents a hydrogen atom, an aliphatic hydrocarbon group having 1 to 5 carbon atoms, or a halogen atom.

[Formula 16]

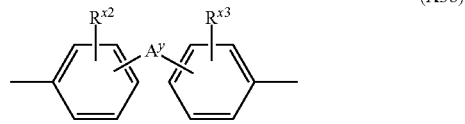

(X3b)

In the general formula (X3b), $R^{x2}$ and $R^{x3}$ each independently represent a hydrogen atom, an aliphatic hydrocarbon group having 1 to 5 carbon atoms, or a halogen atom; and $A^y$ represents an alkylene group or alkylidene group having 1 to 5 carbon atoms, an ether group, a sulfide group, a sulfonyl group, a carboxy group, a ketone group, a single bond, or a group represented by the following general formula (X3b-1).

[Formula 17]

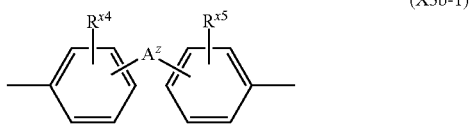

(X3b-1)

In the general formula (X3b-1), $R^{x4}$ and $R^{x5}$ each independently represent a hydrogen atom, an aliphatic hydrocarbon group having 1 to 5 carbon atoms, or a halogen atom; and $A^z$ represents an alkylene group or alkylidene group having 1 to 5 carbon atoms, an ether group, a sulfide group, a sulfonyl group, a carboxy group, a ketone group, or a single bond.

[Formula 18]

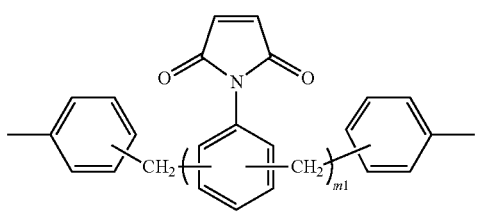

(X3c)

In the general formula (X3c), m1 represents an integer of 1 to 10.

[Formula 19]

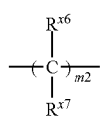

(X3d)

In the general formula (X3d), $R^{x6}$ and $R^{x7}$ each independently represent a hydrogen atom or an aliphatic hydrocarbon group having 1 to 5 carbon atoms; and m2 represents an integer of 1 to 10.

Examples of the modified polyphenylene ether (B) having a terminal modified with a substituent represented by the general formula (X3) include a modified polyphenylene ether having a structure represented by the following general formula (I).

[Formula 20]

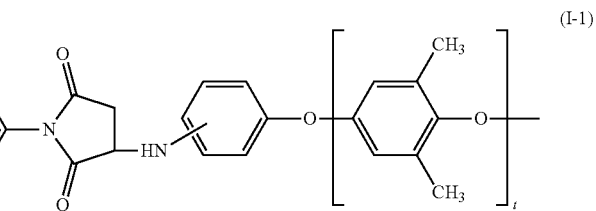

(I)

In the general formula (I), $A^x$ is as defined above; $R^s$ and $R^t$ each independently represent a hydrogen atom, an aliphatic hydrocarbon group having 1 to 5 carbon atoms, or a halogen atom; and t represents an integer of 1 or more.

Specific examples of the structure represented by the general formula (I) include a structure represented by the following general formula (I-1), (I-2), or (I-3).

[Formula 21]

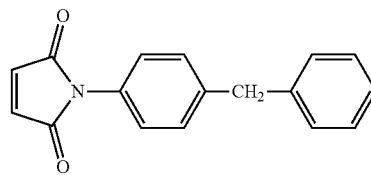

(I-1)

In the general formula (I-1), t is the same as t in the general formula (I).

[Formula 22]

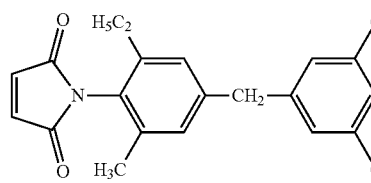

(I-2)

In the general formula (I-2), t is the same as t in the general formula (I).

[Formula 23]

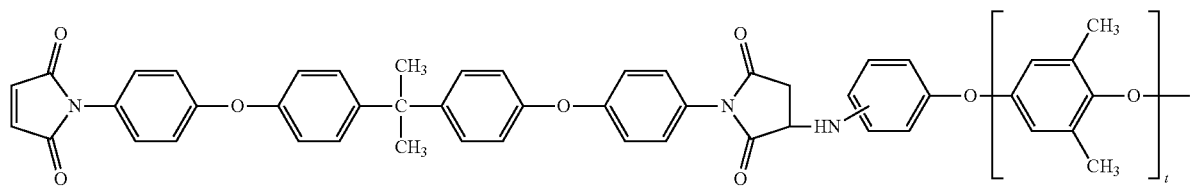

(I-3)

In the general formula (I-3), t is the same as t in the general formula (I).

[Formula 24]

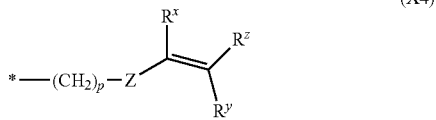

(X4)

In the general formula (X4), $R^x$, $R^y$, and $R^z$ each independently represent a hydrogen atom or an alkyl group (e.g., an alkyl group having 1 to 5 carbon atoms, such as a methyl group or an ethyl group), Z represents an arylene group, p represents an integer of 0 to 10, and * represents a bond.

Among these, a substituent represented by the general formula (X4) is preferable, because further excellent low dielectric loss tangent can be imparted when the resin composition is used for printed wiring board materials (e.g., laminates and metal foil-clad laminates) etc.

In the general formula (X4), Z represents an arylene group. Examples of the arylene group include monocyclic aromatic groups, such as a phenylene group, and polycyclic aromatic groups, such as a naphthalene ring. Moreover, the hydrogen atom bonded to the aromatic ring in the arylene group may be replaced by a functional group (e.g., an alkenyl group, an alkynyl group, a formyl group, an alkylcarbonyl group, an alkenylcarbonyl group, or an alkynylcarbonyl group).

Specific examples of the substituent represented by the general formula (X4) include (iii-1) a substituent represented by the following general formula (X4a) and (iii-2) a substituent represented by the following general formula (X4b).

[Formula 25]

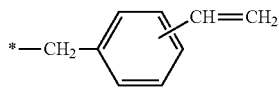

(X4a)

[Formula 26]

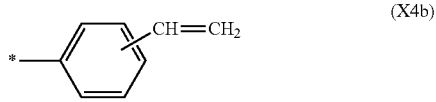

(X4b)

In the general formula (X4a) and the general formula (X4b), * represents a bond.

Among these, (iii-2) a substituent represented by the general formula (X4b) is preferable, because further excellent low dielectric loss tangent can be imparted when the resin composition is used for printed wiring board materials (e.g., laminates and metal foil-clad laminates) etc.

The modified polyphenylene ether (B) of the present embodiment is preferably a compound represented by the following general formula (2), because further excellent low dielectric loss tangent can be imparted when the resin composition is used for printed wiring board materials (e.g., laminates and metal foil-clad laminates) etc.

[Formula 27]

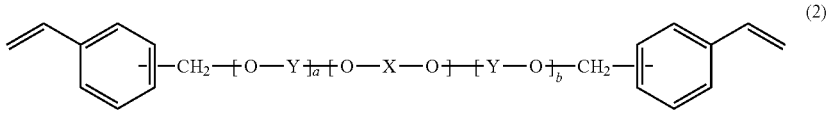

(2)

In the general formula (2), —(O—X—O)— is a structure represented by the following general formula (3) or the following general formula (4); —(Y—O)— is a structure represented by the following general formula (5); when a plurality of —(Y—O)— are continuously arranged, a single type of structure may be arranged, or two or more types of structures may be arranged regularly or irregularly; a and b each independently represent an integer of 0 to 100, and at least one of a and b is not 0.

In the general formula (2), —(O—X—O)— is a structure represented by the following general formula (3) or the following general formula (4).

[Formula 28]

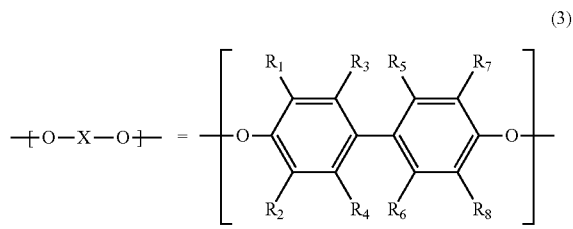

(3)

In the general formula (3), $R_1$, $R_2$, $R_3$, $R_7$, and $R_8$ each independently represent a halogen atom, an alkyl group having 6 or less carbon atoms (e.g., a methyl group, an ethyl group, an n-propyl group, an isopropyl group, an n-butyl group, an isobutyl group, a t-butyl group, an n-pentyl group, or an n-hexyl group), or a phenyl group. Among these, in terms of more effectively and reliably exhibiting the working effects of the present invention, an alkyl group having 6 or less carbon atoms is preferable, an alkyl group having 3 or less carbon atoms is more preferable, and a methyl group is even more preferable. In the general formula (3), $R_4$, $R_5$, and $R_6$ each independently represent a hydrogen atom, a halogen atom, an alkyl group having 6 or less carbon atoms (e.g., a methyl group, an ethyl group, an n-propyl group, an isopropyl group, an n-butyl group, an isobutyl group, a t-butyl group, an n-pentyl group, or an n-hexyl group), or a phenyl group. Among these, in terms of further improving solvent solubility, low viscosity, combustion resistance, and electrical characteristics (particularly low dielectric loss tangent) in good balance, a hydrogen atom or an alkyl group having 6 or less carbon atoms is preferable, a hydrogen atom or an alkyl group having 3 or less carbon atoms is more preferable, and a hydrogen atom or a methyl group is even more preferable. The structure represented by the general formula (3) is preferably a structure represented by the following general formula (6), in terms of more effectively and reliably exhibiting the working effects of the present invention.

[Formula 29]

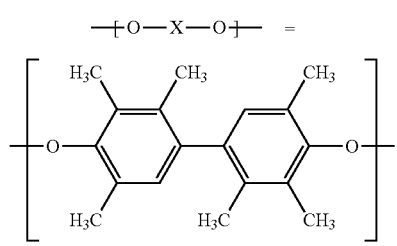

(6)

[Formula 30]

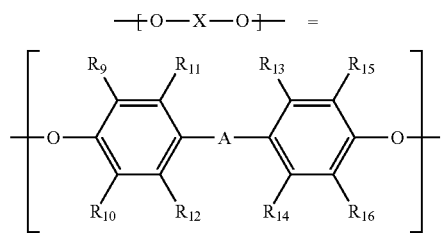

(4)

In the general formula (4), $R_9$, $R_{10}$, $R_{11}$, $R_{12}$, $R_{13}$, $R_{14}$, $R_{15}$, and $R_{16}$ ($R_9$ to $R_{16}$) each independently represent a hydrogen atom, a halogen atom, an alkyl group having 6 or less carbon atoms (e.g., a methyl group, an ethyl group, an n-propyl group, an isopropyl group, an n-butyl group, an isobutyl group, a t-butyl group, an n-pentyl group, or an n-hexyl group), or a phenyl group. Among these, in terms of further improving solvent solubility, low viscosity, combustion resistance, and electrical characteristics (particularly low dielectric loss tangent) in good balance, a hydrogen atom or an alkyl group having 6 or less carbon atoms is preferable, a hydrogen atom or an alkyl group having 3 or less carbon atoms is more preferable, and a hydrogen atom or a methyl group is even more preferable. When $R_9$ to $R_{16}$ each independently represent a hydrogen atom or a methyl group, the structure represented by the general formula (4) is preferably a structure represented by the following general formula (7) or (8), in terms of more effectively and reliably exhibiting the working effects of the present invention.

[Formula 31]

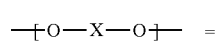

(7)

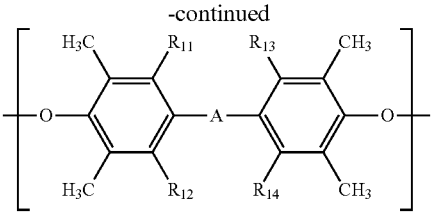

In the general formula (7), $R_{11}$, $R_{12}$, $R_{13}$, and $R_{14}$ each represent a hydrogen atom or a methyl group; and -A- represents a linear, branched, or cyclic divalent hydrocarbon group having 20 or less carbon atoms.

[Formula 32]

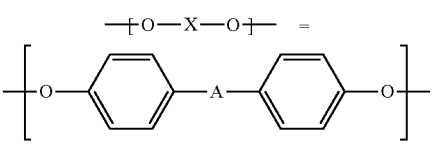

(8)

In the general formula (8), -A- represents a linear, branched, or cyclic divalent hydrocarbon group having 20 or less carbon atoms.

In the general formula (4), the general formula (7), and the general formula (8), examples of A include divalent hydrocarbon groups, such as a methylene group, an ethylidene group, a 1-methylethylidene group, a 1,1-propylidene group, a 1,4-phenylenebis(1-methylethylidene) group, a 1,3-phenylenebis(1-methylethylidene) group, a phenylmethylene group, a naphthylmethylene group, a 1-phenylethylidene group, and a cyclohexylidene group. Among these, in terms of more effectively and reliably exhibiting the working effects of the present invention, A is preferably at least one member selected from the group consisting of a methylene group, an ethylidene group, a 1-methylethylidene group, a 1,1-propylidene group, a 1,4-phenylenebis(1-methylethylidene) group, a 1,3-phenylenebis(1-methylethylidene) group, a phenylmethylene group, a naphthylmethylene group, a 1-phenylethylidene group, and a cyclohexylidene group.

In the general formula (2), —(Y—O)— is represented by the following general formula (5).

[Formula 33]

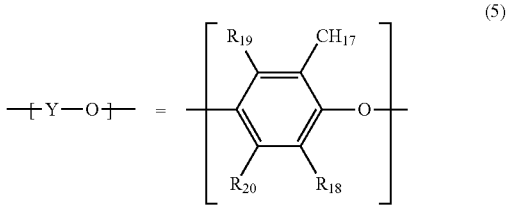

(5)

In the general formula (5), $R_{17}$ and $R_{18}$ each independently represent a halogen atom, an alkyl group having 6 or less carbon atoms (e.g., a methyl group, an ethyl group, an n-propyl group, an isopropyl group, an n-butyl group, an isobutyl group, a t-butyl group, an n-pentyl group, or an n-hexyl group), or a phenyl group. Among these, in terms of further improving solvent solubility, low viscosity, combustion resistance, and electrical characteristics (particularly low dielectric loss tangent) in good balance, an alkyl group having 6 or less carbon atoms is preferable, an alkyl group having 3 or less carbon atoms is more preferable, and a methyl group is even more preferable. In the general formula (5), $R_{19}$ and $R_{20}$ each independently represent a hydrogen atom, a halogen atom, an alkyl group having 6 or less carbon atoms (e.g., a methyl group, an ethyl group, an n-propyl group, an isopropyl group, an n-butyl group, an isobutyl group, a t-butyl group, an n-pentyl group, or an n-hexyl group), or a phenyl group. Among these, in terms of further improving solvent solubility, low viscosity, combustion resistance, and electrical characteristics (particularly low dielectric loss tangent) in good balance, a hydrogen atom or an alkyl group having 6 or less carbon atoms is preferable, a hydrogen atom or an alkyl group having 3 or less carbon atoms is more preferable, and a hydrogen atom or a methyl group is even more preferable. In the general formula (5), it is preferable that $R_{17}$ and $R_{18}$ are methyl groups, and that $R_{19}$ and $R_{20}$ are each independently a hydrogen atom or a methyl group, in terms of further improving manufacturability, solvent solubility, low viscosity, combustion resistance, and electrical characteristics (particularly low dielectric loss tangent) in good balance. In this case, the structure represented by the general formula (5) is more preferably a structure represented by the following general formula (9) or (10), in terms of more effectively and reliably exhibiting the working effects of the present invention.

[Formula 34]

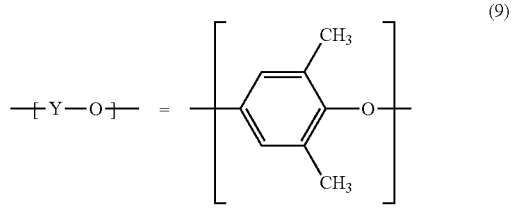
(9)

[Formula 35]

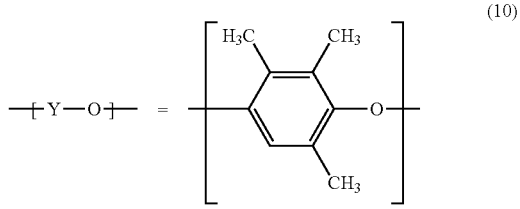
(10)

In the general formula (2), a and b each independently represent an integer of 0 to 100, but at least one of a and b is not 0. a and b preferably each independently represent an integer of 50 or less, and more preferably an integer of 30 or less, in terms of further improving solvent solubility, viscosity, moldability, electrical characteristics (particularly low dielectric loss tangent), and compatibility with other resins in good balance.

In the general formula (2), when a and/or b are plural numbers (2 or more), a plurality of —(Y—O)— may be such that a single type of structure is arranged, or such that two or more types of structures are arranged regularly (e.g., alternately) or irregularly (at random).

In the general formula (2), in terms of more effectively and reliably exhibiting the working effects of the present invention, it is preferable that —(O—X—O)— is a structure represented by the general formula (6), the general formula (7), or the general formula (8), and that —(Y—O)— is a structure represented by the general formula (9) or the general formula (10). When a and/or b are plural numbers (2 or more), the structures represented by the general formula (9) and the general formula (10) may be arranged regularly (e.g., alternately) or irregularly (at random).

In the resin composition of the present embodiment, the modified polyphenylene ether (B) may be composed of a single type or two or more types having different structures.

The number-average molecular weight in terms of polystyrene of the modified polyphenylene ether (B) by the GPC method is preferably 500 or more and 3000 or less. Because the number-average molecular weight is 500 or more, stickiness tends to be further suppressed when the resin composition of the present embodiment is formed into a coating film. Because the number-average molecular weight is 3000 or less, solubility in solvents tends to be further improved.

The modified polyphenylene ether (B) of the present embodiment can be prepared by a known method. For example, as the method for preparing a modified polyphenylene ether (B) having a terminal modified with a substituent represented by the general formula (X3), a primary amino group-containing phenol compound and a polyphenylene ether are subjected to a redistribution reaction in an organic solvent to thereby obtain a polyphenylene ether compound containing a primary amino group in the molecule. Next, the obtained polyphenylene ether compound and a bismaleimide compound are subjected to a Michael addition reaction to thereby obtain a modified polyphenylene ether (B). More specifically, the method described in Japanese Patent No. 6079930 can be used. Further, as the method for preparing a modified polyphenylene ether (B) having a terminal modified with a substituent represented by the general formula (X2) or the general formula (X4), there is a method in which a polyphenylene ether in which the hydrogen atom of the terminal phenolic hydroxyl group is replaced by an alkali metal atom, such as sodium or potassium, is reacted with a compound represented by the general formula (X2-1) or the general formula (X4-1). More specifically, the method described in Japanese Patent Laid-Open No. 2017-128718 can be used.

[Formula 36]

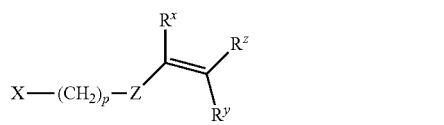
(X2-1)

In the general formula (X2-1), X represents a halogen atom, and $R^x$, $R^y$, $R^z$, Z, and p are the same as, respectively, $R^x$, $R^y$, $R^z$, Z, and p in the general formula (X4).

[Formula 37]

(X4-1)

In the general formula (X4-1), X represents a halogen atom, and $R^a$ is the same as $R^a$ in the general formula (X2).

The preparation method (production method) of the modified polyphenylene ether (B) represented by the general formula (2) of the present embodiment is not particularly limited. For example, the modified polyphenylene ether (B) can be produced by a step of subjecting a bifunctional phenol compound and a monofunctional phenol compound to oxidative coupling to obtain a bifunctional phenylene ether oligomer (oxidative coupling step), and a step of vinylbenzyl-etherifying the terminal phenolic hydroxyl group of the obtained bifunctional phenylene ether oligomer (vinylbenzyl etherification step).

In the oxidative coupling step, a bifunctional phenylene ether oligomer can be obtained, for example, by dissolving a bifunctional phenol compound, a monofunctional phenol compound, and a catalyst in a solvent, and blowing oxygen under heating and stirring. The bifunctional phenol compound is not particularly limited, and examples thereof include at least one member selected from the group consisting of 2,2',3,3',5,5'-hexamethyl-(1,1'-biphenol)-4,4'-diol, 4,4'-methylenebis(2,6-dimethylphenol), 4,4'-dihydroxyphenylmethane, and 4,4'-dihydroxy-2,2'-diphenylpropane. The monofunctional phenol compound is not particularly limited, and examples thereof include 2,6-dimethylphenol and/or 2,3,6-trimethylphenol. The catalyst is not particularly limited, and examples thereof include copper salts (e.g., CuCl, CuBr, CuI, $CuCl_2$, and $CuBr_2$), and amines (e.g., di-n-butylamine, n-butyldimethylamine, N,N'-di-t-butylethylenediamine, pyridine, N,N,N',N'-tetramethylethylenediamine, piperidine, and imidazole). These can be used singly or in combination of two or more. The solvent is not particularly limited, and examples thereof include at least one member selected from the group consisting of toluene, methanol, methyl ethyl ketone, and xylene.

In the vinylbenzyl etherification step, for example, the bifunctional phenylene ether oligomer obtained in the oxidative coupling step and vinylbenzyl chloride are dissolved in a solvent, and a base is added under heating and stirring for reaction, followed by solidification of the resin. Vinylbenzyl chloride is not particularly limited, and examples thereof include at least one member selected from the group consisting of o-vinylbenzyl chloride, m-vinylbenzyl chloride, and p-vinylbenzyl chloride. The base is not particularly limited, and examples thereof include at least one member selected from the group consisting of sodium hydroxide, potassium hydroxide, sodium methoxide, and sodium ethoxide. In the vinylbenzyl etherification step, an acid may be used to neutralize the remaining base after the reaction. The acid is not particularly limited, and examples thereof include at least one member selected from the group consisting of hydrochloric acid, sulfuric acid, phosphoric acid, boric acid, and nitric acid. The solvent is not particularly limited, and examples thereof include at least one member selected from the group consisting of toluene, xylene, acetone, methyl ethyl ketone, methyl isobutyl ketone, dimethylformamide, dimethylacetamide, methylene chloride, and chloroform. Examples of the method for solidifying the resin include a method in which the solvent is evaporated for solidification by drying, and a method in which the reaction liquid is mixed with a poor solvent for reprecipitation.

The content of the modified polyphenylene ether (B) is preferably 1 to 90 parts by mass, more preferably 5 to 85 parts by mass, even more preferably 10 to 70 parts by mass, and particularly preferably 15 to 60 parts by mass, based on 100 parts by mass of the resin solid content in the resin composition. Because the content of the modified polyphenylene ether (B) is within the above range, low dielectric loss tangent and reactivity tend to be further improved.

[3. Filler (C)]

The filler (C) of the present embodiment is not particularly limited, and examples thereof include known inorganic fillers and/or organic fillers. The inorganic filler is not particularly limited, and examples thereof include silica (e.g., fused silica, natural silica, synthetic silica, amorphous silica, Aerosil, hollow silica, and white carbon), metal oxides (e.g., titanium white, zinc oxide, magnesium oxide, zirconium oxide, and alumina), metal nitrides (e.g., boron nitride, aggregated boron nitride, and aluminum nitride), metal sulfates (e.g., barium sulfate), metal hydrates (e.g., aluminum hydroxide, aluminum hydroxide heat-treated products (those obtained by heating aluminum hydroxide to reduce some crystallization water), boehmite, and magnesium hydroxide), molybdenum compounds (e.g., molybdenum oxide and zinc molybdate), zinc (e.g., zinc borate and zinc stannate), clay, kaolin, talc, calcined clay, calcined kaolin, calcined talc, mica, E-glass, A-glass, NE-glass, C-glass, L-glass, D-glass, S-glass, M-glass G-20, short glass fibers (including, for example, glass fine powder, such as E glass, T glass, D glass, S glass, and Q glass), hollow glass, and spherical glass.

The organic filler is not particularly limited, and examples thereof include rubber powder (e.g., styrene type, butadiene type, acrylic type, and core-shell type), silicone resin powder, silicone rubber powder, and silicone composite powder.

These fillers can be used singly or in combination of two or more. Among these, inorganic fillers are preferable, and silica is more preferable, in terms of more effectively and reliably exhibiting the working effects of the present invention.

The content of the filler (C) is not particularly limited, and is preferably 50 to 1600 parts by mass, more preferably 75 to 1200 parts by mass, and even more preferably 75 to 1000 parts by mass (preferably 75 to 750 parts by mass, more preferably 75 to 500 parts by mass, even more preferably 75 to 300 parts by mass, and particularly preferably 100 to 250 parts by mass), based on 100 parts by mass of the resin solid content in the resin composition. Because the content of the filler (C) is within the above range, the moldability of the resin composition tends to be further improved.

In the resin composition of the present embodiment, the filler (C) is preferably used in combination with a silane coupling agent and/or a dispersant (e.g., a wetting and dispersing agent). As the silane coupling agent, for example, those generally used for the surface treatment of inorganic substances are preferable. Examples thereof include aminosilane-based compounds (e.g., γ-aminopropyltriethoxysilane and N-β-(aminoethyl)-γ-aminopropyltrimethoxysilane), epoxysilane-based compounds (e.g., γ-glycidoxypropyltrimethoxysilane and β-(3,4-epoxycyclohexyl)ethyltrimethoxysilane), vinylsilane-based compounds (e.g., γ-methacryloxypropyltrimethoxysilane and vinyl-tri(β-methoxyethoxy)silane), cationic silane-based compounds (e.g., N-β-(N-vinylbenzylaminoethyl)-γ-aminopropyltrimethoxysilane hydrochloride), and phenylsilane-based compounds. The silane coupling agents can be used singly or in combination of two or more.

The content of the silane coupling agent is not particularly limited, and may be about 1 part by mass to 5 parts by mass based on 100 parts by mass of the resin solid content in the resin composition.

The wetting and dispersing agent is, for example, preferably one that is generally used for coating, and more preferably a copolymer-based wetting and dispersing agent. Specific examples of the wetting and dispersing agent include Disperbyk-110, Disperbyk-2009, 111, 161, 180, BYK-W996, BYK-W9010, BYK-W903, and BYK-W940, all of which are products of BYK Japan KK. The wetting and dispersing agents can be used singly or in combination of two or more.

The content of the dispersant (particularly wetting and dispersing agent) is not particularly limited, and may be, for example, about 0.5 to 5 parts by mass based on 100 parts by mass of the resin solid content in the resin composition.

[Other Components (D)]

In terms of improving various characteristics (e.g., peel strength, plating peel strength, moisture absorption heat resistance, strength, elastic modulus, electrical characteristics such as low dielectric loss tangent, glass transition temperature, heat resistance, low thermal expansion rate, low thermal decomposability, and thermal conductivity), the resin composition of the present embodiment preferably further comprises at least one or more other components (D) selected from the group consisting of maleimide compounds other than the polymaleimide compound (A) (hereinafter referred to as "other maleimide compounds"), epoxy resins, phenol resins, oxetane resins, benzoxazine compounds, compounds having a polymerizable unsaturated group other than the modified polyphenylene ether (B) represented by the general formula (2), elastomers, active ester compounds, and cyanate compounds; and preferably further comprises at least one or more other components (D) selected from the group consisting of epoxy resins, phenol resins, oxetane resins, benzoxazine compounds, compounds having a polymerizable unsaturated group other than the modified polyphenylene ether (B), elastomers, and active ester compounds.

[Other Maleimide Compounds]

Other maleimide compounds are not particularly limited, as long as they are compounds having one or more maleimide groups per molecule. Polymaleimide compounds having two or more maleimide groups per molecule may also be used. Examples thereof include 4,4-diphenylmethane bismaleimide, phenylmethane maleimide, m-phenylene bismaleimide, 2,2-bis(4-(4-maleimidephenoxy)-phenyl)propane, 3,3-dimethyl-5,5-diethyl-4,4-diphenylmethane bismaleimide, 4-methyl-1,3-phenylene bismaleimide, 1,6-bismaleimide-(2,2,4-trimethyl)hexane, 4,4-diphenylether bismaleimide, 4,4-diphenylsulfone bismaleimide, 1,3-bis(3-maleimidephenoxy)benzene, 1,3-bis(4-maleimidephenoxy) benzene, polyphenylmethanemaleimide, prepolymers of these maleimide compounds, and prepolymers of these maleimide compounds and amine compounds. These maleimide compounds can be used singly or in combination of two or more.

[Epoxy Resin]

Epoxy resins are not particularly limited, as long as they are compounds or resins having two or more epoxy groups per molecule. Examples thereof include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, cycloaliphatic epoxy resins, polyol-based epoxy resins, and phosphorus-containing epoxy resins; compounds obtained by epoxidation of a double bond of glycidyl amine, glycidyl ester, or butadiene; and compounds obtained by the reaction of hydroxyl group-containing silicone resins and epichlorohydrin. These epoxy resins (D) can be used singly or in combination of two or more. Among these, preferable in terms of further improving flame retardancy and heat resistance are biphenyl aralkyl-based epoxy resins, naphthylene ether-based epoxy resins, polyfunctional phenol-based epoxy resins, and naphthalene-based epoxy resins.

[Phenol Resin]

Phenol resins are not particularly limited, as long as they are phenol resins having two or more hydroxyl groups per molecule. Examples thereof include bisphenol A-based phenol resins, bisphenol E-based phenol resins, bisphenol F-based phenol resins, bisphenol S-based phenol resins, phenolic novolac resins, bisphenol A novolac-based phenol resins, glycidyl ester-based phenol resins, aralkyl novolac phenol resins, biphenyl aralkyl-based phenol resins, cresol novolac-based phenol resins, polyfunctional phenol resins, naphthol resins, naphthol novolac resins, polyfunctional naphthol resins, anthracene-based phenol resins, naphthalene skeleton-modified novolac-based phenol resins, phenol aralkyl-based phenol resins, naphthol aralkyl-based phenol resins, dicyclopentadiene-based phenol resins, biphenyl-based phenol resins, cycloaliphatic phenol resins, polyol-based phenol resins, phosphorus-containing phenol resins, and hydroxyl group-containing silicone resins. These phenol resins can be used singly or in combination of two or more. Among these, preferable in terms of further improving flame resistance is at least one member selected from the group consisting of biphenyl aralkyl-based phenol resins, naphthol aralkyl-based phenol resins, phosphorus-containing phenol resins, and hydroxyl group-containing silicone resins.

[Oxetane Resin]

Oxetane resins are not particularly limited, and examples thereof include oxetane, alkyloxetane (e.g., 2-methyloxetane, 2,2-dimethyloxetane, 3-methyloxetane, and 3,3-dimethyloxetane), 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (a product of Toagosei Co., Ltd.), and OXT-121 (a product of Toagosei Co., Ltd.). These oxetane resins can be used singly or in combination of two or more.

[Benzoxazine Compound]

Benzoxazine compounds are not particularly limited, as long as they are compounds having two or more dihydrobenzoxazine rings per molecule. Examples thereof include bisphenol A-based benzoxazine BA-BXZ (a product of Konishi Chemical Ind. Co., Ltd.), bisphenol F-based benzoxazine BF-BXZ (a product of Konishi Chemical Ind. Co., Ltd.), and bisphenol S-type benzoxazine BS-BXZ (a product of Konishi Chemical Ind. Co., Ltd.). These benzoxazine compounds can be used singly or in combination of two or more.

[Compound Having a Polymerizable Unsaturated Group]

Compounds having a polymerizable unsaturated group other than the modified polyphenylene ether (B) are not particularly limited, and examples thereof include vinyl compounds (e.g., ethylene, propylene, styrene, divinylbenzene, and divinylbiphenyl), acrylates (e.g., methyl (meth)acrylate), (meth)acrylates of mono- or polyalcohols (e.g., 2-hydroxypropyl (meth)acrylate, polypropyleneglycol di(meth)acrylate, trimethylolpropane di(meth)acrylate, trimethylolpropane tri(meth)acrylate, pentaerythritol tetra(meth)acrylate, and dipentaerythritol hexa(meth)acrylate), epoxy (meth)acrylates (e.g., bisphenol A-based epoxy (meth)acrylate and bisphenol F-based epoxy (meth)acrylate), benzocyclobutene resins, and (bis)maleimide resins. These compounds having a polymerizable unsaturated group can be used singly or in combination of two or more.

[Elastomer]

In the present embodiment, elastomers are not particularly limited, and examples thereof include at least one member selected from the group consisting of polyisoprene, polybutadiene, styrene butadiene, butyl rubber, ethylene propylene rubber, styrene butadiene ethylene, styrene butadiene styrene, styrene isoprene styrene, styrene ethylene butylene styrene, styrene propylene styrene, styrene ethylene propylene styrene, fluororubber, silicone rubber, hydrogenated compounds thereof, alkyl compounds thereof, and copolymers thereof. Among these, preferable in terms of excellent electrical characteristics is at least one member selected from the group consisting of styrene butadiene, styrene butadiene ethylene, styrene butadiene styrene, styrene isoprene styrene, styrene ethylene butylene styrene, styrene propylene styrene, styrene ethylene propylene styrene, hydrogenated compounds thereof, alkyl compounds thereof, and copolymers thereof; and more preferable in terms of further excellent compatibility with the modified polyphenylene ether (B) is at least one member selected from the group consisting of styrene butadiene rubber, butadiene rubber, and isoprene rubber.

In the present embodiment, the elastomer preferably has an SP value of 9 $(cal/cm^3)^{1/2}$ or less, in terms of excellent electrical characteristics. The SP value is called a solubility parameter and is calculated from the square root $(cal/cm^3)^{1/2}$ of heat of vaporization required to vaporize 1 $cm^3$ of liquid. In general, the polarity is lower as this value is smaller, and two components have higher affinity as their SP values are closer. When the SP value of the elastomer is 9 $(cal/cm^3)^{1/2}$ or less, electrical characteristics more suitable for resin compositions used in printed wiring boards for high-frequency applications can be obtained.

In the present embodiment, it is preferable that the elastomer has a weight-average molecular weight in terms of polystyrene by the GPC method of 80000 or more and is solid at 25° C., because crack resistance is further improved when the resin composition is used for printed wiring board materials (e.g., laminates and metal foil-clad laminates) etc. In contrast, when the elastomer has a weight-average molecular weight in terms of polystyrene by the GPC method of 40000 or less and is liquid at 25° C., warpage is reduced when a film coated with the elastomer is pasted together to a base material; thus, the resin composition is particularly suitable as a build-up material of a printed wiring board.

[Active Ester Compound]

Active ester compounds are not particularly limited, and examples thereof include compounds having two or more active ester groups per molecule. Linear, branched, or cyclic compounds can also be used. Among these, preferable in terms of further improving heat resistance is an active ester compound obtained by the reaction of a carboxylic acid compound and/or a thiocarboxylic acid compound, and a hydroxy compound and/or a thiol compound; more preferable is an active ester compound obtained by the reaction of a carboxylic acid compound and one or more compounds selected from the group consisting of phenol compounds, naphthol compounds, and thiol compounds; even more preferable is an aromatic compound having two or more active ester groups per molecule obtained by the reaction of a carboxylic acid compound and an aromatic compound having a phenolic hydroxyl group; and particularly preferable is an aromatic compound having two or more active ester groups per molecule obtained by the reaction of a compound having at least two or more carboxylic acids per molecule and an aromatic compound having a phenolic hydroxyl group. Examples of the above carboxylic acid compound include one or more members selected from the group consisting of benzoic acid, acetic acid, succinic acid, maleic acid, itaconic acid, phthalic acid, isophthalic acid, terephthalic acid, and pyromellitic acid. Among these, in terms of further improving heat resistance, preferable is one or more members selected from the group consisting of succinic acid, maleic acid, itaconic acid, phthalic acid, isophthalic acid, and terephthalic acid; and more preferable is one or more members selected from the group consisting of isophthalic acid and terephthalic acid. Examples of the above thiocarboxylic acid compound include one or more member selected from the group consisting of thioacetic acid and thiobenzoic acid. Examples of the above phenol compound or naphthol compound include one or more members selected from the group consisting of hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac. In terms of further improving heat resistance and solvent solubility, preferable are bisphenol A, bisphenol F, bisphenol S, methylated bisphenol A, methylated bisphenol F, methylated bisphenol S, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac; more preferable is one or more members selected from the group consisting of catechol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac; even more preferable is one or more members selected from the group consisting of 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolac; and particularly preferable is one or more members selected from the group consisting of dihydroxybenzophenone, trihydroxybenzophenone, tetrahydroxybenzophenone, dicyclopentadienyl diphenol, and phenol novolac (preferably one or more members selected from the group consisting of dicyclopentadienyl diphenol and phenol novolac, and more preferably dicyclopentadienyl diphenol). Examples of the above thiol compound include one or more members selected from the group consisting of benzene dithiol and triazine dithiol. Moreover, the active ester compound is preferably a compound having at least two or more carboxylic acids per molecule and containing an aliphatic chain, in terms of further improving the compatibility with epoxy resins; and preferably a compound having an aromatic ring, in terms of further improving heat resistance. More specific examples of the active ester compound include the active ester compounds described in Japanese Patent Laid-Open No. 2004-277460. These active ester compounds can be used singly or in combination of two or more.

The active ester compound may be a commercial product or may be prepared by a known method. Examples of the commercial product include compounds containing a dicyclopentadienyl diphenol structure (e.g., EXB9451, EXB9460, EXB9460S, and HPC-8000-65T (all of which are products of DIC Corporation)), acetylated phenol novolac (e.g., DC808 (a product of Japan Epoxy Resin K.K.)), and benzoylated phenol novolac (e.g., YLH1026, YLH1030, and YLH1048 (all of which are products of Japan Epoxy Resin K.K.)). EXB9460S is preferable in terms of further improving the storage stability of the varnish and the low thermal expansion rate of the cured product.

The active ester compound can be prepared by a known method, and can be obtained, for example, by the condensation reaction of a carboxylic acid compound and a hydroxy compound. Specific examples include a method in which (a) a carboxylic acid compound or a halide thereof, (b) a hydroxy compound, and (c) an aromatic monohydroxy compound are reacted at a ratio of 0.05 to 0.75 mol of the phenolic hydroxyl group of (b) and 0.25 to 0.95 mol of (c) per mole of the carboxyl group or acid halide group of (a).

[Cyanate Compound]

Examples of the cyanate compound include at least one member selected from the group consisting of naphthol aralkyl-based cyanate compounds, naphthylene ether-based cyanate compounds, xylene resin-based cyanate compounds, trisphenolmethane-based cyanate compounds, and adamantane skeleton-based cyanate compounds. Among these, preferable in terms of further improving plating adhesion and low water absorption properties is at least one member selected from the group consisting of naphthol aralkyl-based cyanate compounds, naphthylene ether-based cyanate compounds, and xylene resin-based cyanate compounds; and more preferable are naphthol aralkyl-based cyanate compounds. These cyanate compounds may be prepared by a known method or may be commercial products. Cyanate compounds having a naphthol aralkyl skeleton, a naphthylene ether skeleton, a xylene skeleton, a trisphenolmethane skeleton, or an adamantane skeleton have a relatively large functional group equivalent and less unreacted cyanate groups; thus, water absorption properties tend to be further reduced. Moreover, plating adhesion tends to be further improved mainly due to the presence of an aromatic skeleton or an adamantane skeleton.

The content of the other component(s) (D) is preferably 20 to 700 parts by mass, more preferably 50 to 600 parts by mass, even more preferably 50 to 400 parts by mass, and still more preferably 50 to 300 parts by mass, based on 100 parts by mass of the resin solid content in the resin composition, in terms of improving low thermal expansion, suppression of warpage, and electrical characteristics (particularly low dielectric loss tangent) in a good balance.

[Curing Accelerator]

For example, when containing a cyanate compound, an epoxy resin, or the like as the other component(s) (D), the resin composition of the present embodiment may contain a curing accelerator for suitably adjusting the cure rate. As the curing accelerator, those that are generally used as curing accelerators, such as cyanate compounds and epoxy resins, can be used. Examples thereof include organic metal salts (e.g., zinc octylate, zinc naphthenate, cobalt naphthenate, copper naphthenate, acetylacetone iron, nickel octylate, and manganese octylate), phenol compounds (e.g., phenol, xylenol, cresol, resorcinol, catechol, octylphenol, and nonylphenol), alcohols (e.g., 1-butanol and 2-ethylhexanol), imidazoles (e.g., 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole), and derivatives, such as adducts of carboxylic acids of these imidazoles or acid anhydrides thereof, amines (e.g., dicyandiamide, benzyldimethylamine, and 4-methyl-N,N-dimethylbenzylamine), phosphorus compounds (e.g., phosphine-based compounds, phosphine oxide-based compounds, phosphonium salt-based compounds, and diphosphine-based compounds), epoxy-imidazole adduct-based compounds, peroxides (e.g., benzoyl peroxide, p-chlorobenzoyl peroxide, di-t-butyl peroxide, diisopropyl peroxycarbonate, and di-2-ethylhexyl peroxycarbonate), and azo compounds (e.g., azobisisobutyronitrile). The curing accelerators can be used singly or in combination of two or more.

The content of the curing accelerator may be generally about 0.005 to 10 parts by mass based on 100 parts by mass of the resin solid content in the resin composition.

The resin composition of the present embodiment may contain, in addition to the above components, other thermosetting resins, thermoplastic resins, oligomers thereof, and other various polymer compounds, as well as various additives. Examples of additives include flame retardants, ultraviolet absorbents, antioxidants, photopolymerization initiators, fluorescent brighteners, photosensitizers, dyes, pigments, thickeners, flow modifiers, lubricants, defoaming agents, dispersants, leveling agents, brighteners, and polymerization inhibitors. These additives can be used singly or in combination of two or more.

[Organic Solvent]

The resin composition of the present embodiment may contain an organic solvent. In this case, the resin composition of the present embodiment is in a state in which at least some, preferably all, of the resin components described above are dissolved in or compatible with an organic solvent (solution or varnish). The organic solvent is not particularly limited, as long as it is a polar organic solvent or apolar organic solvent that can dissolve or be compatible with at least some, preferably all, of the resin components described above. Examples of polar organic solvents include ketones (e.g., acetone, methyl ethyl ketone, and methyl isobutyl ketone), cellosolves (e.g., propylene glycol monomethyl ether and propylene glycol monomethyl ether acetate), esters (e.g., ethyl lactate, methyl acetate, ethyl acetate, butyl acetate, isoamyl acetate, ethyl lactate, methyl methoxypropionate, and methyl hydroxyisobutyrate), and amides (e.g., dimethoxyacetamide and dimethylformamide). Examples of apolar organic solvents include aromatic hydrocarbons (e.g., toluene and xylene). These organic solvents can be used singly or in combination of two or more.

[Application]

The resin composition of the present embodiment can be suitably used as an insulating layer of a printed wiring board, and a semiconductor package material. The resin composition of the present embodiment can be suitably used as a material constituting a prepreg, a metal foil-clad laminate using a prepreg, a resin composite sheet, and a printed wiring board.

(Prepreg)

The prepreg of the present embodiment comprises a base material and the resin composition of the present embodiment impregnated or applied to the base material. The prepreg of the present embodiment is obtained, for example, by impregnation or application of the resin composition of the present embodiment to a base material, followed by drying at 120 to 220° C. for about 2 to 15 minutes for semi-curing. In this case, the amount of the resin composition attached to the base material, that is, the amount of the resin composition (including the filler (C)) based on the total amount of the semi-cured prepreg, is preferably within the range of 20 to 99 mass %.

The base material is not particularly limited, as long as it is a base material used for various printed wiring board materials. Examples of materials for the base material include glass fibers (e.g., E glass, D glass, L glass, S glass, T glass, Q glass, UN glass, NE glass, and spherical glass), inorganic fibers other than glass (e.g., quartz), and organic fibers (e.g., polyimide, polyamide, polyester, and liquid crystal polyester). The form of the base material is not particularly limited, and examples thereof include woven fabrics, non-woven fabrics, roving, chopped strand mats, and surfacing mats. These base materials can be used singly or in combination of two or more. Among these base materials, woven fabrics with ultra-opening treatment or clogging treatment are preferable in terms of dimensional stability, glass woven fabrics surface-treated by silane coupling agents, such as epoxysilane treatment and amino silane treatment, are preferable in terms of moisture absorption heat resistance, and liquid crystal polyester woven fabrics are preferable in terms of electrical characteristics. The thickness of the base material is not particularly limited, and may be, for example, about 0.01 to 0.2 mm.

(Metal Foil-Clad Laminate)

The metal foil-clad laminate of the present embodiment has at least one or more stacked prepregs of the present embodiment, and a metal foil disposed on one side or both sides of the prepreg(s). The metal foil-clad laminate of the present embodiment is produced, for example, by a method in which at least one or more prepregs of the present embodiment are stacked, and metal foil is disposed on one side or both sides thereof, followed by laminate molding. More specifically, the metal foil-clad laminate of the present embodiment can be produced by disposing metal foil, such as copper or aluminum, on one side or both sides of the prepreg(s), followed by laminate molding. The metal foil is not particularly limited, as long as it is used for printed wiring board materials, and examples thereof include copper foil, such as rolled copper foil and electrolytic copper foil. The thickness of copper foil is not particularly limited, and may be about 2 to 70 μm. As the molding method, a method generally used to mold a printed wiring board laminate and a multilayer board can be used. More specific examples include a method in which laminate molding is carried out using a multistage press, a multistage vacuum press, a continuous-molding machine, or an autoclave molding machine at a temperature of about 180 to 350° C. for a heating time of about 100 to 300 minutes at a surface pressure of about 20 to 100 kg/cm². Moreover, laminate molding can be carried out using the prepreg of the present embodiment in combination with a separately produced inner layer wiring board to form a multilayer board. As the method for producing a multilayer board, for example, copper foil with a thickness of about 35 μm is disposed on both sides of one prepreg of the present embodiment, and laminate molding is carried out by the above molding method. Then, an inner layer circuit is formed, and blackening treatment is performed on this circuit to form an inner layer circuit board. Subsequently, the inner layer circuit boards and the prepregs of the present embodiment are alternately arranged one by one. Further, copper foil is arranged on the outermost layer, and laminate molding is carried out under the above conditions, preferably under vacuum, to produce a multilayer board. The metal foil-clad laminate of the present embodiment can be suitably used as a printed wiring board.

(Printed Wiring Board)

The printed wiring board of the present embodiment comprises an insulating layer and a conductor layer disposed on the surface of the insulating layer, and the insulating layer comprises the resin composition of the present embodiment. Such a printed wiring board can be produced in accordance with a conventional method, and the production method is not particularly limited. The following shows an example of the method for producing a printed wiring board. First, a metal foil-clad laminate, such as a copper-clad laminate mentioned above, is prepared. Next, the surface of the metal foil-clad laminate is etched to form an inner layer circuit, and an inner layer substrate is produced. The surface of the inner layer circuit of the inner layer substrate is subjected to surface treatment to increase bond strength, if necessary. Subsequently, a needed number of prepregs described above are stacked on the surface of the inner layer circuit, and metal foil for an outer layer circuit is further laminated on the outside thereof, followed by heat pressing for integral molding. In this way, a multilayer laminate in which an insulating layer comprising a base material and a cured product of a thermosetting resin composition is formed between the inner layer circuit and the outer layer circuit metal foil, is produced. Subsequently, this multilayer laminate is subjected to drilling process for through-holes or via holes. Then, a plating metal film is formed on the wall surface of the hole to conduct the inner layer circuit and the outer layer circuit metal foil. Further, the outer layer circuit metal foil is etched to form an outer layer circuit. Thus, a printed wiring board is produced.

The printed wiring board obtained in the above production example has an insulating layer and a conductor layer formed on the surface of the insulating layer, and the insulating layer comprises the resin composition of the present embodiment described above. That is, the prepreg of the present embodiment described above (a base material and the resin composition of the present embodiment impregnated or applied to the base material), or the layer of the resin composition of the metal foil-clad laminate of the present embodiment described above (the layer comprising the resin composition of the present invention) is composed of an insulating layer comprising the resin composition of the present embodiment.

(Resin Composite Sheet)

The resin composite sheet of the present embodiment comprises a support and the resin composition of the present embodiment disposed on the surface of the support. The resin composite sheet can be used as a build-up film or a dry film solder resist. The method for producing a resin composite sheet is not particularly limited, and examples thereof include a method in which a solution obtained by dissolving the resin composition of the present embodiment in a solvent is applied (coated) to a support and dried to obtain a resin composite sheet.

Examples of the support used herein include, but are not limited to, organic film base materials, such as polyethylene films, polypropylene films, polycarbonate films, polyethylene terephthalate films, ethylene tetrafluoroethylene copolymer films, mold release films obtained by applying a mold-releasing agent to the surface of these films, and polyimide films; conductive foil, such as copper foil and aluminum foil; glass plates, SUS plates, FRP, and other plate-like supports.

Examples of the application method (coating method) include methods in which a solution obtained by dissolving the resin composition of the present embodiment in a solvent is applied to a support by a bar coater, a die coater, a doctor blade, or a baker applicator. Moreover, after drying, the support is removed or etched from the resin composite sheet in which the support and the resin composition are laminated, whereby a monolayer sheet (resin sheet) can be obtained. A monolayer sheet (resin sheet) can also be obtained, without using a support, by supplying a solution obtained by dissolving the resin composition of the present embodiment in a solvent into a mold having a sheet-like cavity, followed by drying etc. to form it into a sheet.

In the production of the monolayer sheet or resin composite sheet of the present embodiment, the drying conditions when the solvent is removed are not particularly limited. However, the solvent tends to remain in the resin composition at a low temperature, and the curing of the resin composition proceeds at a high temperature; thus, drying is preferably performed at a temperature of 20° C. to 200° C. for 1 to 90 minutes. Moreover, in the monolayer sheet or resin composite sheet, the resin composition can be used in an uncured state only after the solvent is dried, or can also be used in a semi-cured state (B stage), if necessary. Furthermore, the thickness of the resin layer of the monolayer or resin composite sheet of the present embodiment can be adjusted by the density and coating thickness of the solution of the resin composition of the present embodiment, and is not particularly limited. In general, the solvent is more likely to remain during drying as the coating thickness is thicker; thus, the thickness is preferably 0.1 to 500 μm.

EXAMPLES

The present invention is described in more detail below, while showing a Synthesis Example, Examples, and Comparative Examples; however, the present invention is not limited thereto.

(Synthesis Example 1) Synthesis of Modified Polyphenylene Ether (B)

(Synthesis of Bifunctional Phenylene Ether Oligomer)

9.36 g (42.1 mmol) of $CuBr_2$, 1.81 g (10.5 mmol) of N,N'-di-t-butylethylenediamine, 67.77 g (671.0 mmol) of n-butyldimethylamine, and 2,600 g of toluene were placed in a 12-L longitudinal reactor equipped with a stirrer, a thermometer, an air inlet tube, and a baffle plate, and stirred at a reaction temperature of 40° C. A mixed solution of 129.32 g (0.48 mol) of 2,2',3,3',5,5'-hexamethyl-(1,1'-biphenol)-4,4'-diol, 878.4 g (7.2 mol) of 2,6-dimethylphenol, 1.22 g (7.2 mmol) of N,N'-di-t-butylethylenediamine, and 26.35 g (260.9 mmol) of n-butyldimethylamine, which were previously dissolved in 2,300 g of methanol, was added dropwise over 230 minutes, while bubbling a mixed gas of nitrogen and air adjusted to an oxygen concentration of 8% at a flow rate of 5.2 L/min, and the resulting mixture was stirred. After the completion of dropping, 1,500 g of water with 48.06 g (126.4 mmol) of tetrasodium ethylenediaminetetraacetate dissolved therein was added to terminate the reaction. The aqueous layer and the organic layer were separated, and the organic layer was washed with a 1 N hydrochloric acid aqueous solution and then purified water. The obtained solution was concentrated by an evaporator to 50 mass % to obtain 1981 g of toluene solution of bifunctional phenylene ether oligomer (resin "A"). The number-average molecular weight in terms of polystyrene by the GPC method of the resin "A" was 1975, the weight-average molecular weight in terms of polystyrene by the GPC method was 3514, and the hydroxyl group equivalent was 990.

(Synthesis of Modified Polyphenylene Ether)

833.4 g of toluene solution of the resin "A," 76.7 g of vinylbenzyl chloride ("CMS-P," manufactured by Seimi Chemical Co., Ltd.), 1,600 g of methylene chloride, 6.2 g of benzyldimethylamine, 199.5 g of purified water, and 83.6 g of 30.5 mass % NaOH aqueous solution were placed in a reactor equipped with a stirrer, a thermometer, and a reflux tube, and stirred at a reaction temperature of 40° C. After stirring for 24 hours, the organic layer was washed with a 1 N hydrochloric acid aqueous solution and then purified water. The obtained solution was concentrated by an evaporator, and solidified by dropping into methanol. The solid was collected by filtration and vacuum-dried to obtain 450.1 g of modified polyphenylene ether (B). The number-average molecular weight in terms of polystyrene by the GPC method of the modified polyphenylene ether (B) was 2250, the weight-average molecular weight in terms of polystyrene by the GPC method was 3920, and the vinyl group equivalent was 1189 g/vinyl group.

Example 1

77 parts by mass of a polymaleimide compound (A) represented by the following general formula (1a) ("MIR-3000," a product of Nippon Kayaku Co., Ltd.), 20 parts by mass of the modified polyphenylene ether (B) obtained in Synthesis Example 1, 3 parts by mass of naphthalene skeleton-modified novolac-based epoxy resin ("HP-9900," a product of DIC Corporation), 150 parts by mass of fused silica ("SC2050-MB (a product of Admatechs Co., Ltd.)"), 1.3 parts by mass of wetting and dispersing agent (1.0 part by mass of "Disperbyk-161 (a product of BYK Japan KK)" and 0.3 parts by mass of "Disperbyk-2009 (a product of BYK Japan KK)"), and 0.5 parts by mass of TPIZ (2,4,5-triphenylimidazole) were dissolved in methyl ethyl ketone and mixed to obtain varnish. Each of the above addition amounts represents the solids content, and the same applies to the Examples and Comparative Examples, described later. This varnish was further diluted with methyl ethyl ketone, impregnated and coated to an NE glass woven fabric having a thickness of 0.1 mm, and dried by heating at 150° C. for 5 minutes to obtain a prepreg containing 60 mass % of resin composition (including a filler).

[Formula 38]

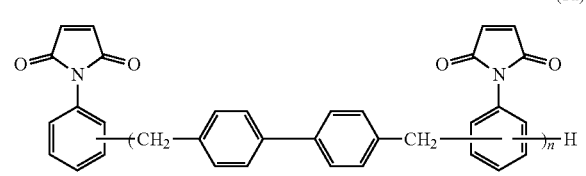

(1a)

(in the general formula (1a), n is an average value and represents 1.4.)

8 prepregs obtained above were stacked, and 12-μm-thick electrolytic copper foil (3EC-M3-VLP, manufactured by Mitsui Mining & Smelting, Co., Ltd.) was disposed on and below the prepregs. Then, laminate molding was carried out at a pressure of 30 kgf/cm² at a temperature of 220° C. for 120 minutes to obtain a metal foil-clad laminate with an insulating layer thickness of 0.8 mm. Using the obtained metal foil-clad laminate, the copper foil peel strength, water absorption, desmear resistance, dielectric loss tangent, and flame resistance were evaluated. Table 1 shows the evaluation results.

Comparative Example 1

A metal foil-clad laminate was obtained in the same manner as in Example 1, except that, in place of the polymaleimide compound (A) represented by the general formula (1a), 77 parts by mass of another maleimide compound ("BMI-70," a product of K.I Chemical Industry Co., Ltd.) was used, and 0.5 parts by mass of 2-ethyl-4-methylimidazole was further used. Using the obtained metal foil-clad laminate, the copper foil peel strength, water absorption, desmear resistance, dielectric loss tangent, and flame resistance were evaluated. Table 1 shows the evaluation results.

TABLE 1

| | | | Example 1 | Comparative Example 1 |
|---|---|---|---|---|
| Evaluation | Copper foil peel strength | kN/cm | 0.70 | 0.43 |
| | Water absorption (%) | 1 h | 0.44 | 0.63 |
| | | 3 h | 0.46 | 0.66 |
| | | 5 h | 0.48 | 0.66 |
| | Desmear resistance (%) | Once | −0.27 | −0.51 |
| | | Twice | −0.59 | −0.98 |
| | | 3 times | −0.88 | −1.32 |
| | Dielectric loss tangent (Df) | | 0.0039 | 0.0042 |
| | Flame resistance | Determination | V-0 | V-1 |
| | | Average burning time (S) | 3.9 | 13.9 |

(Measurement Method and Evaluation Method)
(1) Copper Foil Peel Strength:
Using the metal foil-clad laminates obtained in the Examples and Comparative Examples, the copper foil tear strength (copper foil peel strength) was measured according to JIS C6481.
(2) Water Absorption:
Samples obtained by cutting the metal foil-clad laminates obtained in the Examples and Comparative Examples into a size of 30 mm×30 mm were each treated according to JIS C648 using a pressure cooker tester (PC-3 type, a product of Hirayama Manufacturing Corporation) at 121° C. at 2 atm for 1 hour, 3 hours, and 5 hours, after which the water absorption was measured. In Table 2, "1 h" corresponds to the water absorption after treatment for 1 hour, "3 h" corresponds to the water absorption after treatment for 3 hours, and "5 h" corresponds to the water absorption after treatment for 5 hours.
(3) Desmear Resistance:
After the copper foils of the metal foil-clad laminates obtained in the Examples and Comparative Examples were removed by etching, the following dipping treatment was performed. First, the laminate from which the copper foil was removed was dipped in a swelling liquid (Swelling Dip Securiganth P, a product of Atotech Japan K.K.) at 80° C. for 10 minutes. Next, the dipped laminate was dipped in a roughening liquid (Concentrate Compact CP, a product of Atotech Japan K.K.) at 80° C. for 5 minutes. Next, the dipped laminate was dipped in a neutralizing liquid (Reduction Conditioner Securiganth P500, a product of Atotech Japan K.K.) at 45° C. for 10 minutes. The amount of decrease in mass (mass %) after dipping treatment once, the amount of decrease in mass (mass %) after dipping treatment twice, and the amount of decrease in mass (mass %) after dipping treatment 3 times were measured. In Table 2, "Once" corresponds to "the amount of decrease in mass (mass %) after dipping treatment once," "Twice" corresponds to "the amount of decrease in mass (mass %) after dipping treatment twice," and "3 times" corresponds to "the amount of decrease in mass (mass %) after dipping treatment 3 times."

(4) Dielectric Loss Tangent (Df):
Using samples obtained by removing, by etching, the copper foils of the metal foil-clad laminates obtained in the Examples and Comparative Examples, the dielectric constant (Dk) and dielectric loss tangent at 10 GHz were measured by an evanescent-mode cavity resonator (Agilent 8722ES, a product of Agilent Technologies).

(5) Flame Resistance:
Using samples obtained by removing, by etching, the copper foils of the metal foil-clad laminates obtained in the Examples and Comparative Examples, a flame resistance test was performed according to the UL94 vertical burning test method, and the average burning time was measured.

Example 2

A metal foil-clad laminate was obtained in the same manner as in Example 1, except that 7 parts by mass of the polymaleimide compound (A) represented by the general formula (1a) was used, and 90 parts by mass of the modified polyphenylene ether (B) obtained in Synthesis Example 1 was used. Using the obtained metal foil-clad laminate, the copper foil peel strength, water absorption, desmear resistance, and flame resistance were measured in the same manner as in Example 1, and evaluated in accordance with the following criteria. The following table shows the results.

Example 3

A metal foil-clad laminate was obtained in the same manner as in Example 1, except that 47 parts by mass of the polymaleimide compound (A) represented by the general formula (1a) was used, and 50 parts by mass of the modified polyphenylene ether (B) obtained in Synthesis Example 1 was used. Using the obtained metal foil-clad laminate, the copper foil peel strength, water absorption, desmear resistance, and flame resistance were measured in the same manner as in Example 1, and evaluated in accordance with the following criteria. The following table shows the results.

Comparative Example 2

A metal foil-clad laminate was obtained in the same manner as in Comparative Example 1, except that 7 parts by mass of another maleimide compound ("BMI-70," a product of K.I Chemical Industry Co., Ltd.) was used, and 90 parts by mass of the modified polyphenylene ether (B) obtained in Synthesis Example 1 was used. Using the obtained metal foil-clad laminate, the copper foil peel strength, water absorption, desmear resistance, and flame resistance were measured in the same manner as in Example 1, and evaluated in accordance with the following criteria. The following table shows the results.

Comparative Example 3

A metal foil-clad laminate was obtained in the same manner as in Comparative Example 1, except that 47 parts by mass of another maleimide compound ("BMI-70," a product of K.I Chemical Industry Co., Ltd.) was used, and 50 parts by mass of the modified polyphenylene ether (B) obtained in Synthesis Example 1 was used. Using the obtained metal foil-clad laminate, the copper foil peel strength, water absorption, desmear resistance, and flame resistance were measured in the same manner as in Example 1, and evaluated in accordance with the following criteria. The following table shows the results.

(1) Copper Foil Peel Strength

The copper foil peel strength (unit: kN/cm) measured in the same manner as in Example 1 was evaluated in accordance with the following criteria.

[Criteria]
A: 0.6 or more
B: 0.5 or more and less than 0.6
C: Less than 0.5

(2) Water Absorption

The water absorption (5 h) measured in the same manner as in Example 1 was evaluated in accordance with the following criteria.

[Criteria]
A: Less than 0.5%
B: 0.5% or more and less than 0.6%
C: 0.6% or more (3) Desmear Resistance The desmear resistance (the amount of decrease in mass (mass %) after dipping treatment 3 times) measured in the same manner as in Example 1 was evaluated in accordance with the following criteria.

[Criteria]
A: Less than 0.5 mass %
B: 0.5 mass % or more and less than 1.0 mass %
C: 1.0 mass % or more (4) Flame Resistance The flame resistance (average burning time) measured in the same manner as in Example 1 was evaluated in accordance with the following criteria.

[Criteria]
A: Less than 10 seconds
B: 10 seconds or more and less than 15 seconds
C: 15 seconds or more and less than 20 seconds
D: 20 seconds or more The following shows the evaluation results of each Example and Comparative Example, including the evaluation results of Example 1 and Comparative Example 1.

INDUSTRIAL APPLICABILITY

As described above, the resin composition of the present invention can be widely and effectively used, for example, as an electrical insulation material, a semiconductor plastic package, a sealing material, an adhesive, a laminating material, a resist, or a build-up laminate material, in various applications, such as electrical and electronic materials, machine-tool materials, and aeronautical materials. In particular, the resin composition of the present invention can be particularly effectively used as a printed wiring board material corresponding to recent higher integration and higher density of information terminal devices, communication devices, etc. Moreover, since the laminate, metal foil-clad laminate, etc., of the present invention particularly have excellent peel strength, low water absorption properties, desmear resistance, and flame resistance, their industrial practicality is very high.

The disclosure of Japanese Patent Application No. 2018-1490 filed on Jan. 9, 2018 is incorporated herein by reference in its entirety.

Further, all the documents, patent applications, and technical standards described in the specification are incorporated herein by reference to the same extent as if the individual documents, patent applications, and technical standards were specifically and individually indicated to be incorporated by reference.

The invention claimed is:

1. A resin composition comprising a polymaleimide compound (A) represented by the following formula (1), a modified polyphenylene ether (B) having a terminal modified with a substituent containing a carbon-carbon unsaturated double bond, and a filler (C),

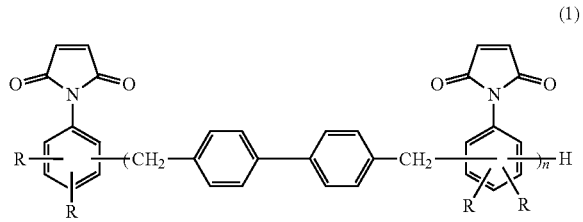

wherein a plurality of R each independently represent a hydrogen atom, an alkyl group having 1 to 5 carbon atoms, or a phenyl group; and n is an average value and represents $1 < n \leq 5$; and wherein the resin composition is devoid of organic peroxides.

2. The resin composition according to claim 1, wherein the modified polyphenylene ether (B) is represented by the following formula (2):

TABLE 2

| | | Example 1 | Example 2 | Example 3 | Comparative Example 1 | Comparative Example 2 | Comparative Example 3 |
|---|---|---|---|---|---|---|---|
| Evaluation | Copper foil peel strength | A | B | B | C | B | C |
| | Water absorption (%) | A | A | A | C | A | B |
| | Desmear resistance (%) | B | A | B | C | A | B |
| | Flame resistance | A | C | B | B | D | D |

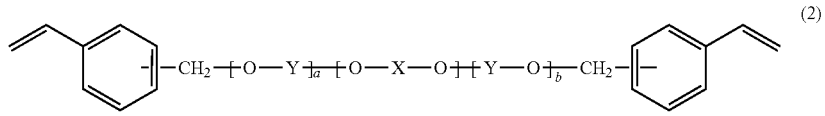

wherein —(O—X—O)— is a structure represented by the following formula (3) or the following formula (4); —(Y—O)— is a structure represented by the following formula (5); when a plurality of —(Y—O)— are continuously arranged, a single type of structure may be arranged, or two or more types of structures may be arranged regularly or irregularly; a and b each independently represent an integer of 0 to 100, and at least one of a and b is not 0,

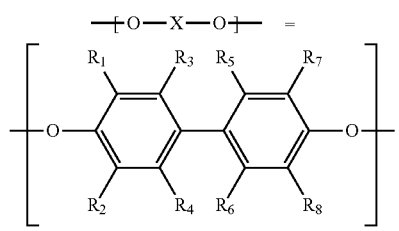

wherein $R_1$, $R_2$, $R_3$, $R_7$, and $R_8$ each independently represent a halogen atom, an alkyl group having 6 or less carbon atoms, or a phenyl group; and $R_4$, $R_5$, and $R_6$ each independently represent a hydrogen atom, a halogen atom, an alkyl group having 6 or less carbon atoms, or a phenyl group,

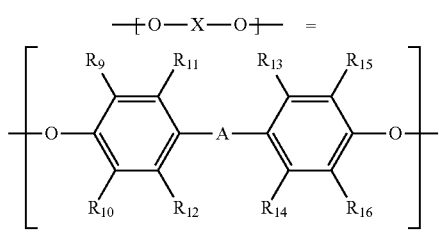

wherein $R_9$, $R_{10}$, $R_{11}$, $R_{12}$, $R_{13}$, $R_{14}$, $R_{15}$, and $R_{16}$ each independently represent a hydrogen atom, a halogen atom, an alkyl group having 6 or less carbon atoms, or a phenyl group; and -A- represents a linear, branched, or cyclic divalent hydrocarbon group having 20 or less carbon atoms,

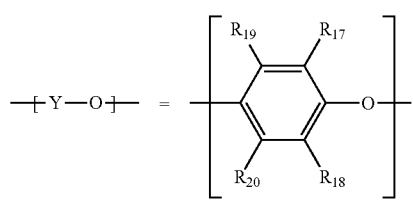

wherein $R_{17}$ and $R_{18}$ each independently represent a halogen atom, an alkyl group having 6 or less carbon atoms, or a phenyl group; and $R_{19}$ and $R_{20}$ each independently represent a hydrogen atom, a halogen atom, an alkyl group having 6 or less carbon atoms, or a phenyl group.

3. The resin composition according to claim 2, wherein in the formula (2), —(O—X—O)— is a structure represented by the following formula (6), the following formula (7), or the formula (8); —(Y—O)— is a structure represented by the following formula (9) or the following formula (10); and when a plurality of —(Y—O)— are continuously arranged, a single type of structure is arranged, or the structures represented by the following formula (9) and the following formula (10) are arranged regularly or irregularly:

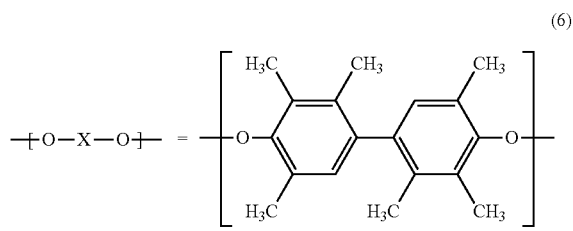

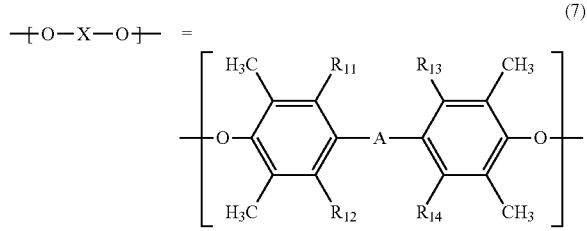

wherein $R_{11}$, $R_{12}$, $R_{13}$, and $R_{14}$ each independently represent a hydrogen atom or a methyl group, and -A- represents a linear, branched, or cyclic divalent hydrocarbon group having 20 or less carbon atoms,

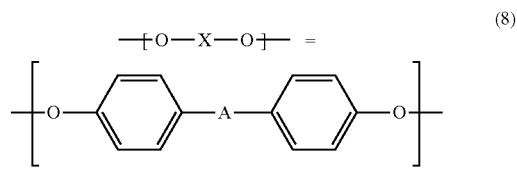

wherein -A- represents a linear, branched, or cyclic divalent hydrocarbon group having 20 or less carbon atoms,

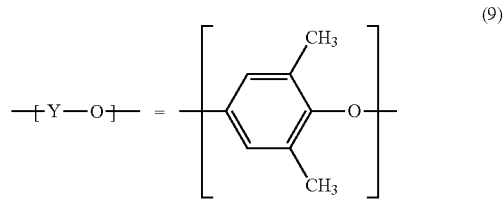

-continued

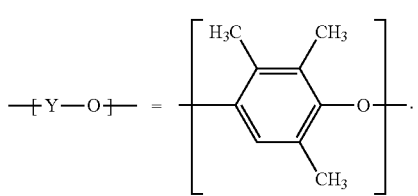

(10)

4. The resin composition according to 1, wherein the content of the polymaleimide compound (A) represented by the formula (1) is 1 to 90 parts by mass based on 100 parts by mass of resin solid content in the resin composition.

5. The resin composition according to claim 1, wherein the content of the modified polyphenylene ether (B) is 1 to 90 parts by mass based on 100 parts by mass of resin solid content in the resin composition.

6. The resin composition according to claim 1, further comprising at least one or more other components (D) selected from the group consisting of maleimide compounds other than the polymaleimide compound (A) represented by the formula (1), epoxy resins, phenol resins, oxetane resins, benzoxazine compounds, compounds having a polymerizable unsaturated group other than the modified polyphenylene ether (B), elastomers, active ester compounds, and cyanate compounds.

7. The resin composition according to claim 1, wherein the content of the filler (C) in the resin composition is 50 to 1600 parts by mass based on 100 parts by mass of the resin solid content.

8. A prepreg comprising a base material and the resin composition according to claim 1 impregnated or applied to the base material.

9. A metal foil-clad laminate comprising at least one or more stacked prepregs according to claim 8, and a metal foil disposed on one side or both sides of the prepregs.

10. A resin composite sheet comprising a support and the resin composition according to claim 1 disposed on a surface of the support.

11. A printed wiring board comprising an insulating layer and a conductor layer disposed on a surface of the insulating layer, wherein the insulating layer comprises the resin composition according to claim 1.

12. The resin composition according to claim 1, wherein the resin composition may include a curing accelerator, wherein the curing accelerator if present is selected from at least one of: organic metal salts; phenol compounds; alcohols; imidazoles, and derivatives, including adducts of carboxylic acids of these imidazoles or acid anhydrides thereof; amines; phosphorus compounds; epoxy-imidazole adduct-based compounds; and azo compounds.

* * * * *